United States Patent [19]

Belohoubek

[11] 4,395,687

[45] Jul. 26, 1983

[54] ADJUSTABLE PHASE SHIFTER

[75] Inventor: Erwin F. Belohoubek, Kendall Park, N.J.

[73] Assignee: RCA Corporation, New York, N.Y.

[21] Appl. No.: 272,288

[22] Filed: Jun. 10, 1981

[51] Int. Cl.³ .................... H03H 11/20; H01P 1/18
[52] U.S. Cl. ............................. 333/164; 328/155; 333/156; 330/124 R; 330/286; 330/295
[58] Field of Search ........................ 333/156–161, 333/164, 139; 328/155; 343/777–778, 854; 330/124 R, 286, 295

[56] References Cited

U.S. PATENT DOCUMENTS

| 3,323,080 | 5/1967 | Schwelb et al. .................. 333/157 |
| 4,161,705 | 7/1979 | Nemit et al. ..................... 333/156 |
| 4,297,641 | 10/1981 | Sterzer .......................... 333/139 X |

OTHER PUBLICATIONS

U.S. Appln. Ser. No. 80,103 of Fred Sterzer, filed 9/28/79, "Serrodyning System Employing an Adjustable Phase Shifting Circuit".

*Primary Examiner*—Marvin L. Nussbaum
*Attorney, Agent, or Firm*—Joseph S. Tripoli; Robert L. Troike

[57] ABSTRACT

An adjustable phase shifter for adjustably providing a 360° range of phase shift to RF signals by dividing the RF signals into three equal parts, adjusting the relative amplitudes of the parts of the RF signals and combining the three parts of the RF signals at relative phase angles of 0°, 120° and 240°.

7 Claims, 6 Drawing Figures

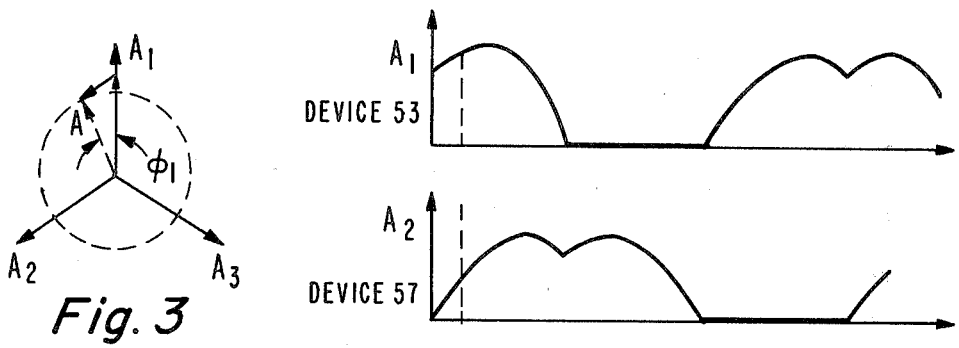
Fig. 3
Fig. 4
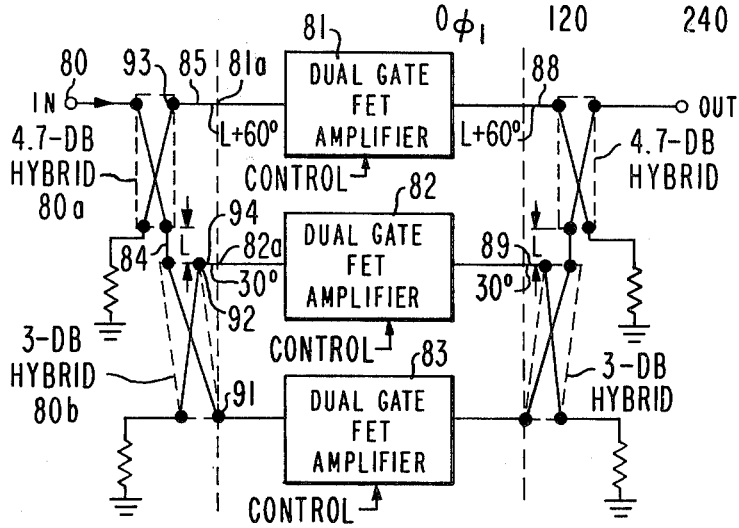
Fig. 5
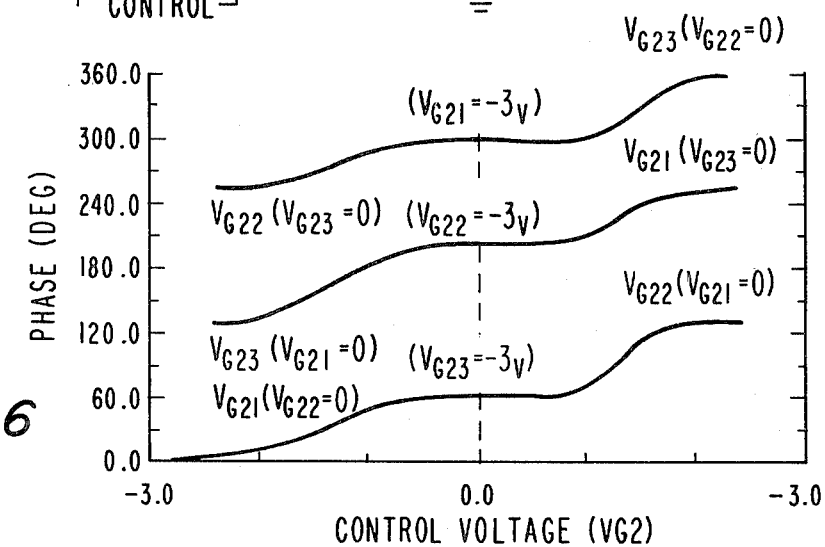
Fig. 6

ADJUSTABLE PHASE SHIFTER

This invention relates to phase shifting circuits and more particularly, to an adjustable phase shifter.

Phase shifting circuits are used for a number of diverse applications such as biphase modulation for secure communications, serrodyning and beam steering of phased array antennas. Most conventional adjustable phase shifters use PIN diodes to produce phase shifts up to 360° in incremental steps. A four-bit phase shifter, for example, has 16 steps of $22\frac{1}{2}$° each. For smooth phase control a large number of individual steps are necessary which makes the phase shifter bulky and lossy. Continuous phase control without steps is possible with ferrites or traveling wave tubes but these structures are quite large and not suitable, for example, for light weight phased array antenna systems which need a phase shifter for each antenna element.

A means for generating a continuously adjustable phase shift has been described in a patent application, assigned to the same assignee as the present application, Ser. No. 80,103, of Fred Sterzer, filed Sept. 28, 1979 and entitled, "SERRODYNING SYSTEM EMPLOYING AN ADJUSTABLE PHASE SHIFTING CIRCUIT." It uses amplitude control of two FETs to generate a 0°-90° phase shift. Two such 0°-90° phase shifts in addition to a 180° junction are required to cover the full 360° range.

In accordance with one embodiment of the present invention, an adjustable phase shifter comprises means for power dividing an input signal into three components. The three power divided signals are separately applied to three controllable circuits and shifted in phase such that the three components are approximately 120° apart. The outputs of the three circuits are then combined. A means is coupled to the control terminals of the amplifiers for respectively applying control signals to control the RF level of the signals produced at the output terminals of the amplifier, thereby controlling the phase of the combined signal.

In the drawing:

FIG. 3 is a vector diagram useful in understanding the circuit of FIG. 2;

FIG. 4 is a plot of amplitude relations of vectors A1, A2, A3 as a function of phase angle;

FIG. 5 is a diagram partially in block and partially in schematic form, of a phase shifter in accordance with another embodiment of the present invention; and FIG. 6 is a plot of phase vs. control voltage for the phase shifter of FIG. 5.

Figure 1:
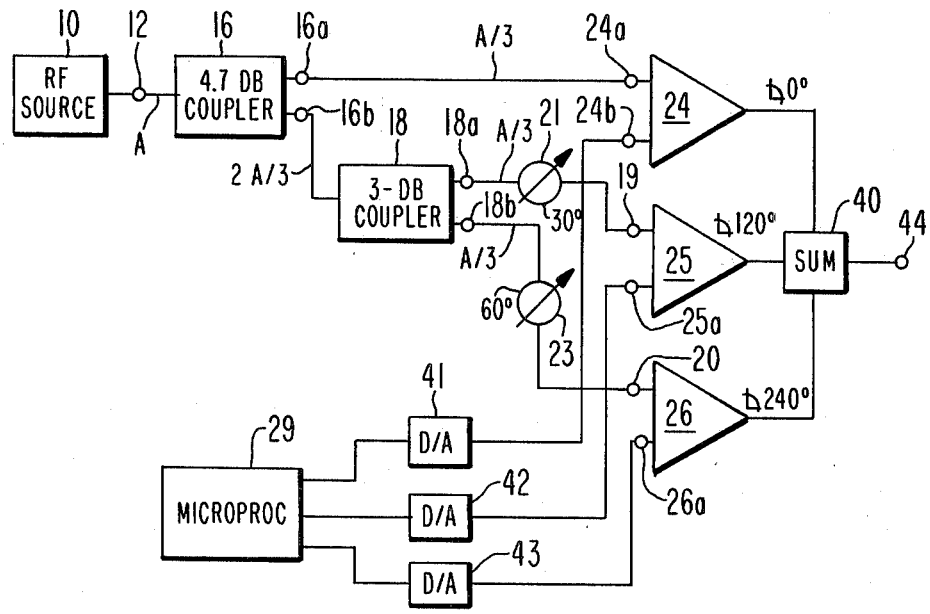
FIG. 1 is a block diagram of an adjustable phase shifter and control circuit therefore in accordance with one embodiment of the present invention.

In FIG. 1, a suitable radio frequency (RF) signal source 10 of power level A is coupled to the terminal 12 of the phase shifter 14 in accordance with the present invention. Although the present invention is particularly useful at microwave frequencies, its principles of operation are applicable to other frequencies. Terminal 12 is coupled to a 4.7-DB power splitter 16 of conventional design, which may be implemented, for example, by waveguide coupler, power divider or microstrip coupler where one-third or A/3 (ignoring losses) of the power exits at terminal 16a and another two-thirds (2 A/3) of the power exits at terminal 16b. The output at terminal 16b is then applied to the input of another power splitter 18 which in this case is a 3-DB power splitter with one-half the power exiting at terminal 18a and the other half at terminal 18b. Since the power level of signals to power splitter 18 is equal to two-thirds of the original input signal, the signal level output at terminal 18a is equal to one-third (A/3) the original input power (A) and also the power at 18b is equal to one-third (A/3) the original power (A) at 18b. In this manner (ignoring losses), the signals at terminals 16a, 18a and 18b are each approximately equal to each other and to one-third the original input power. Assuming the phase of the signal at input terminal 24a is, for example, 0°, the phase of the signal from the output at terminal 18a is adjusted so that the phase of the signal at point 19 is approximately 120° relative to that at terminal 24a. Similarly, the phase of the signal at terminal 20 is 240° relative to the signal at terminal 24a. The additional phase shifts at terminals 19 and 20 are introduced by the power dividers 16 and 18 and the additional phase shifters 21 and 23, the latter providing, for example, phase shifts of about 30° and 60°, respectively. Hybrid 16 provides 90° relative phase shift between signal at its output terminals 16a and 16b with output at terminal 16a at reference phase and hybrid 18 provides another 90° relative phase shift between signals at its output terminals 18a and 18b with the signal output at terminal 18a at reference phase plus 90°, undergoing no additional phase shift through hybrid 18. The output at terminal 18b is at reference phase plus 180°.

The signals at reference phase terminal 24a are applied to the input of an adjustable level signal translating device 24. Similarly, the output from terminal 18a at reference phase plus 90° is shifted 30° in phase shifter 21 and consequently a signal of reference phase plus 120° is applied at input terminal 19 of a second adjustable level signal translating device 25. The output from terminal 18b at reference phase plus 180° is shifted 60° at phase shifter 23 and consequently a signal of reference phase plus 240° is applied at input terminal 20 of a third adjustable level signal translating device 26. These adjustable signal translating devices 24, 25 and 26 may be, for example, dual gate FET (field effect transistor) amplifiers. In this case the terminals 24a, 19 and 20 are coupled to the first gate of the corresponding FET amplifier. The devices 24, 25 and 26 may also comprise vacuum tubes, bipolar transistors or single gate FETs. A dual gate FET particularly suited to this application is described in "A Four-Eight Gigahertz (GHz) Dual Gate Amplifier," by J. Goel et al., 1978, *IEEE International Solid State Circuits Conference,* pages 126–127. The output from the FET amplifier devices 24, 25 and 26 are coupled to a vector summing means 40 which sums vectorially the amplitudes and phases of the signals from these three amplifiers to provide a vectorially summed output at terminal 44. The gains of the amplifier devices 24, 25 and 26 are controlled for the example of a dual gate FET by the application of signals to the second gate terminals 24b, 25a and 26a, respectively, of, for example, FET amplifier devices 24, 25 and 26. These control signals could be provided, for example, by a microprocessor, such as microprocessor 29, which stores in its memory for selected phase shift values a set of three binary signals which are applied to three separate digital-to-analog converters 41, 42 and 43, wherein the binary values stored are converted to amplitude levels which control, in turn, the gains of amplifier devices 24, 25 and 26, respectively.

Figure 2:
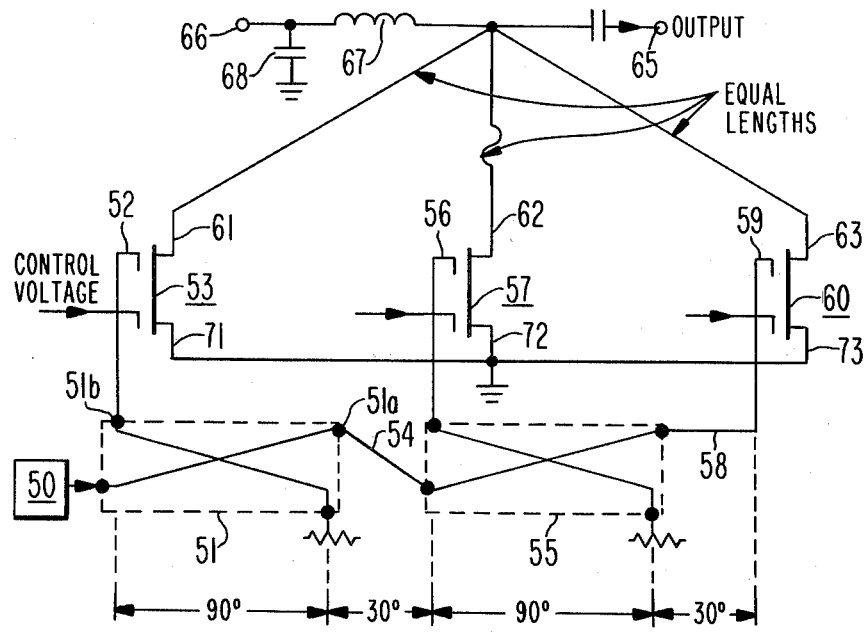
FIG. 2 is a schematic diagram of a phase shifter according to another embodiment of the present invention.

FIG. 2 illustrates a phase shifter using dual gate FET devices 53, 57 and 60 in accordance with another embodiment of the present invention. Signals from the source 50 are applied to a 4.7-DB coupler 51 which may be, for example, an interdigitated hybrid coupler as described by J. Lange, entitled "Interdigitated Strip Line Quadature Hybrid," in *IEEE Transactions MTT,* Volume 17, pages 1150-1151, December 1969. One-third of the signal from the source 50 is coupled to gate 52 of FET device 53 at a first phase call it the reference or zero phase. Two-thirds of the signal from the source 50 is applied via the hybrid 51 to a 30° line length phase delay means 54. The signal from delay means 54 is supplied to a second intedigitated hybrid coupler 55. The second hybrid coupler 55 is a 3-DB hybrid coupler and provides one-half of the signal from the hybrid 51 to a first gate 56 of a second dual gate FET device 57. The hybrid 51 provides 90° relative phase delay of the output at terminal 51a relative to terminal 51b. Since delay means 54 provides 30° delay, the relative phase difference of the signals at gate 52 and gate 56 is about 120°. The other one-third power from hybrid 55 is applied via second 30° phase delay means 58 to a first gate 59 of third FET device 60. The signal through the hybrid 55 to line length phase delay 58 undergoes 90° additional phase shift through the hybrid 55. Accordingly, at the input to delay means 58 the signal has undergone a total delay of 90°+120° and as the delay means 58 inserts an additional phase shift of 30°, the phase of the signal at gate 59 is 240° relative to the phase of the signal at gate 52.

The drain electrodes 61, 62 and 63 of the FET devices 53, 57 and 60 are coupled via a coupling capacitor to a common output terminal 65 and to a source of the DC bias potential at terminal 66 via RF choke 67 and bypass capacitor 68. The source electrodes 71, 72 and 73 of the dual gate FET devices 53, 57 and 60 are coupled to ground or reference potential.

As in FIG. 1, the second gate electrodes of the FET devices 53, 57 and 60 are coupled to a control signal source with individually controls the control voltage applied to each FET. The source may include, for example, a microprocessor and D/A converters which convert the stored data from the microprocessor to voltage level signals to provide the proper relative control signal amplitudes to the second gates of the three devices 53, 57 and 60 to achieve the selected phase shift of the RF signals from the source 50 to output terminal 65.

FIG. 3 illustrates the respective vector amplitudes associated with the three amplifier devices 53, 57 and 60 of FIG. 2 to obtain any desired resultant phase with a constant amplitude. Referring to FIG. 4, these vector amplitudes are controlled by adjusting the gains of the amplifiers, whose outputs, as illustrated in FIG. 2, are combined in phase. The vectors A1, A2 and A3 represent the amplitudes of the output signals produced by the three amplifier devices 53, 57 and 60, respectively, required to generate a signal with constant amplitude and continuously varying phase, as shown in FIG. 4. As noted in FIG. 4, the gain of amplifier device 60 is controlled to be such that the output A3 is zero between 0° and 120° phase and the gains of amplifier devices 53 and 57 are adjusted. The gain of amplifier device 53 is controlled so that output level (A1) is relatively high near 0° phase and drops off to zero at 120° phase. Between 120° and 240° phase amplifier device 53 is cut off and the gains of amplifier devices 57 and 60 are adjusted. The gain of the amplifier device 60 is such that A3 begins to climb at 120°, as shown. The gain of amplifier 57 is controlled to be such that between 240° and 0° phase the output level A2 is zero and the gains of amplifier devices 53 and 60 are adjusted from about 240° to 0° as, is shown.

FIG. 5 illustrates a symmetrical circuit configuration in accordance with another embodiment of the present invention. In this arrangement the power from the input port 80 passes through a 4.7-DB coupler 80a and a 3-DB coupler 80b to provide three equal power inputs to FET amplifiers 81, 82 and 83. The input to dual gate FET 83 passes through two hybrids (the 4.7-DB hybrid and the 3-DB hybrid) to provide a phase difference of 60° between dual gate FET amplifier 82 and dual gate FET amplifier 83. The output from terminal 91 of the 3-DB hybrid 80b is shifted by the hybrid 90° relative to the output at the other terminal 92. Extra line section 94 from terminal 92 to the input 82a of FET amplifier 82 provides an extra phase delay of 30° to thereby provide 60° relative phase difference between the signals at terminals 82a and 91. There is a length L (in degrees of phase shift) of transmission line 84 between the 4.7-DB hybrid 80a and the 3-DB hybrid 80b. The signal at terminal 92 of the 3-DB hybrid 80b is L+90° phase relative to the signal at terminal 93 of 4.7-DB hybrid 80a. A section 85 of transmission line is positioned between terminal 93 and input terminal 81a of amplifier 81 to provide a delay equal to L+60° so that there is a 60° [(L+90°+30°)-(L+60°)] relative phase difference between the inputs to amplifiers 81 and 82. Similarly, the outputs from the amplifiers 81, 82 and 83 are combined via an identical network of 4.7-DB hybrid and 3-DB hybrid separated by a section of transmission line of length L. The output from amplifier 82 undergoes 30° extra phase shift through section 89 of line to the 3-DB hybrid. The output signal from FET amplifier 83 undergoes 90° phase shift in the 3-DB hybrid relative to that from the section 89 of line so that the signals from the two amplifiers are combined with 60° relative phase by the output network. This makes a total of 120° relative phase shift (60°+60°) through the total input and output networks. The output from FET amplifier 81 undergoes an extra L+60° phase shift with extra lead length section 88 and the output from FET amplifier 82 undergoes an extra 30° phase shift through the line length section 89, a phase shift due to length L of line between the 4.7-DB hybrid and the 3-DB hybrid and 90° phase shift through the hybrid. The output network thus provides 60° [(L+30°+90°)-(L+60°)] relative phase difference or a total system phase difference of 120°.

A phase shifter as discussed in FIG. 5 was constructed using GaAs dual gate FETs as made by NEC (Nippon Electric Co.) type 46300. The three individual amplifiers have typical gains of about 10-DB with variations less than ±0.5-DB over a 15.8-16.7 gigahertz band. Each amplifier provided greater than 30-DB gain variation by adjustment of voltages at gate 2 between 0 and −3 volts. Phase tuning as a function of the amplifier second gate gain control voltages ($V_{G2}$) is illustrated in FIG. 6. In this case, one gate voltage is kept at 0 volts, one at −3 volts, while the third is varied between 0 to −3 volts to cover, in each case, approximately 60° phase shift. Under these conditions, the amplitude varies by about 7.5-DB over the full tuning range from 0° to 360°. By using appropriate gate control algorithms, two of the three gate voltages are separately adjusted for each phase angle, a constant amplitude with 8-DB insertion loss can be achieved. In addition, the overall amplitude can be varied by 20-DB, changing the gate voltages of all three amplifiers simultaneously.

What is claimed is:

1. A signal controlled radio frequency (RF) phase shifter comprising:
   divider means responsive to an RF input signal for power dividing said RF input signal into three power divided RF signals at substantially equal power levels;
   means comprising first, second and third circuits, respectively, each having an RF signal input terminal, a control signal terminal, and an output terminal, each circuit being receptive of a different one of said power divided RF signals at its input terminal for providing an RF signal at its output terminal at an amplitude which is a function of a parameter of a control signal applied to its control signal terminal; and
   means for combining the RF signals present at said output terminal of said first, second and third circuits at relative phases of 0°, 120° and 240°, respectively, so that by adjustment of said parameter of the control signals applied to the respective control terminals of said first, second and third circuits the phase shift imparted to said RF input signal can be controlled through 360°.

2. The combination of claim 1 wherein each of said first, second and third circuits comprise a dual gate FET amplifier, one gate comprising the RF signal input terminal of said circuit and the other gate comprising the control signal terminal of said circuit.

3. The combination of claim 2 wherein said dividing means includes a 4.7-DB hybrid coupler and a 3-DB hybrid coupler connected in series.

4. The combination of claim 3 wherein said means for combining includes a 30° phase shifter between said 4.7-DB hybrid coupler and said 3-DB hybrid coupler and said second 30° hybrid at the output of said 3-DB hybrid coupler.

5. The combination of claim 4 wherein the first output of said 4.7-DB coupler is coupled to a first gate electrode of said FET amplifier and a second output of said 4.7-DB hybrid is coupled to a 30° phase delay means and wherein an input of said 3-DB hybrid coupler is coupled to said 30° phase delay means and one output of said 3-DB hybrid coupler is coupled to first gate of a second of said FET amplifier and the second output of said 3-DB hybrid is coupled via a second 30° phase shifting means to a first gate of a third FET amplifier.

6. The combination as claimed in claim 5 wherein the drain terminals of the FET amplifiers are coupled together and to said output terminal.

7. A signal controlled radio frequency phase shifter comprising:
   means responsive to an RF signal for dividing said RF signal into three substantially equal parts of relative phases of 0°, 60° and 120°;
   means comprising first, second and third circuits each having an RF input terminal receptive of a different one of said parts of said RF signal, an amplitude control signal terminal, and an output terminal, each said circuit providing an RF output at its output terminal of an amplitude which is a function of a parameter of a control signal applied to its control signal terminal; and
   means for combining the RF signals present at said output terminals of said first, second and third circuits at relative phases of 0°, 60° and 120°, respectively, so that by adjustment of said parameters of the control signals applied to the respective control terminals of said first, second and third circuits, the phase imparted to said RF input signal can be controlled through 360°.

* * * * *

UNITED STATES PATENT AND TRADEMARK OFFICE
CERTIFICATE OF CORRECTION

PATENT NO. : 4,395,687

DATED : July 26, 1983

INVENTOR(S) : Erwin F. Belohoubek

It is certified that error appears in the above-identified patent and that said Letters Patent is hereby corrected as shown below:

Column 1, line 25, before "It" insert ---This is now U.S. Patent No. 4,297,641, issued October 27, 1981.---.

Column 5, line 27, before "terminals" insert ---signal---.

Column 6, line 36, before "terminals" insert ---signal---.

Signed and Sealed this

Third Day of January 1984

[SEAL]

Attest:

GERALD J. MOSSINGHOFF

*Attesting Officer*   *Commissioner of Patents and Trademarks*